(12) United States Patent
Hui et al.

(10) Patent No.: US 9,536,883 B2
(45) Date of Patent: Jan. 3, 2017

(54) DUAL ANTI-FUSE

(75) Inventors: Frank Hui, Irvine, FL (US); Neal Kistler, Laguna Niguel, CA (US)

(73) Assignee: BROADCOM CORPORATION, Irvine, CA (US)

( * ) Notice: Subject to any disclaimer, the term of this patent is extended or adjusted under 35 U.S.C. 154(b) by 412 days.

(21) Appl. No.: 13/548,123

(22) Filed: Jul. 12, 2012

(65) Prior Publication Data

US 2014/0015095 A1 Jan. 16, 2014

(51) Int. Cl.
*H01L 29/00* (2006.01)
*H01L 27/10* (2006.01)
*H01L 23/525* (2006.01)

(52) U.S. Cl.
CPC ......... *H01L 27/101* (2013.01); *H01L 23/5252* (2013.01); *H01L 23/5256* (2013.01); *H01L 2924/0002* (2013.01)

(58) Field of Classification Search
CPC . H01L 23/525; H01L 23/5252; H01L 23/5256
USPC .............................. 257/401, 619, 528–530, E29.13,257/E29.259, E29.264, E29.267
See application file for complete search history.

(56) References Cited

U.S. PATENT DOCUMENTS

2010/0232203 A1* 9/2010 Chung et al. ................ 365/96
2013/0270559 A1* 10/2013 Hafez ............... H01L 27/11206
257/50

FOREIGN PATENT DOCUMENTS

| CN | 104025293 A | | 9/2014 |
|---|---|---|---|
| JP | 2010-034266 | | 2/2010 |
| JP | 2010-034266 A | | 2/2010 |
| JP | 2010034266 A | * | 2/2010 |
| KR | 10-2005-0093768 | | 8/2005 |

OTHER PUBLICATIONS

Korean Office Action issued Jun. 26, 2014 in Korean Application No. 10-2013-0081946 (no English translation), 4 pages.
Taiwan Office Action issue Mar. 2, 2015 in application No. 102124356, (no English translation), 6 pages.
Chinese Office Action dated Sep. 6, 2015, issued in Chinese Patent Application No. 201310285046.8.
Chinese Office Action dated May 10, 2016, issued in Chinese Patent Application No. 201310285046.8.

\* cited by examiner

*Primary Examiner* — Matthew E Warren
(74) *Attorney, Agent, or Firm* — Oblon, McClelland, Maier & Neustadt, L.L.P.

(57) ABSTRACT

According to one exemplary implementation, a dual anti-fuse structure includes a first channel in a common semiconductor fin adjacent to a first programmable gate. The dual anti-fuse structure further includes a second channel in said common semiconductor fin adjacent to a second programmable gate. A first anti-fuse is formed between the first channel and the first programmable gate. Furthermore, a second anti-fuse is formed between the second channel and the second programmable gate. The first programmable gate can be on a first sidewall of the common semiconductor fin and can comprise a first gate dielectric and a first electrode. The second programmable gate can be on a second sidewall of the common semiconductor fin and can comprise a second gate dielectric and a second electrode.

22 Claims, 7 Drawing Sheets

DUAL ANTI-FUSE

BACKGROUND

An anti-fuse can be configured in a planar arrangement with a source, a drain, and a channel situated in a semiconductor substrate. A programmable gate is situated over the channel and includes a gate electrode situated over a gate dielectric. The gate dielectric initially provides a high-resistance current path between the gate electrode and the channel of the anti-fuse. The anti-fuse can be programmed by applying a programming voltage across the gate electrode and the channel so as cause breakdown of the gate dielectric. Once programmed, the current path changes from high-resistance to low-resistance to facilitate current flow through the current path.

SUMMARY

The present disclosure is directed to a dual anti-fuse, substantially as shown in and/or described in connection with at least one of the figures, and as set forth more completely in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
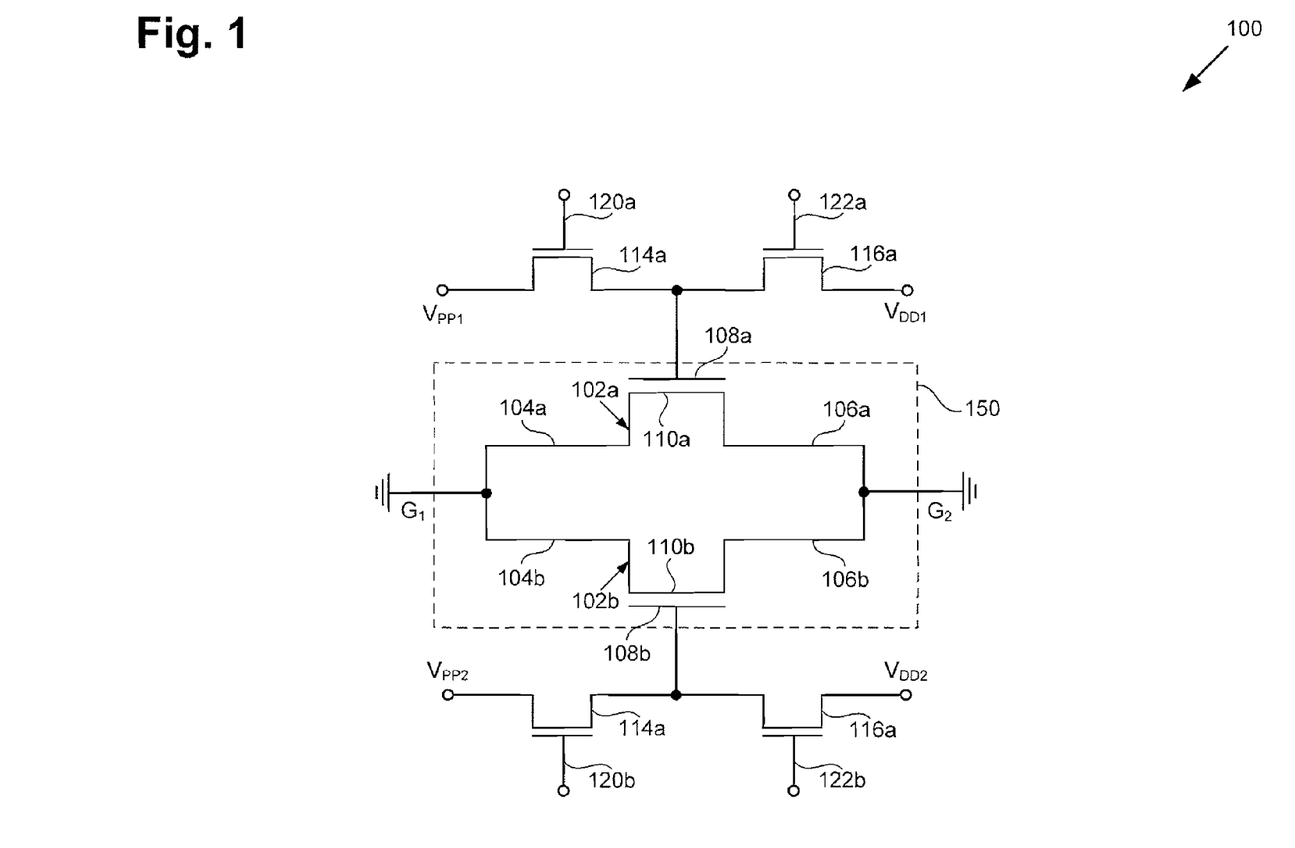
FIG. 1 illustrates a schematic diagram of an exemplary circuit including a dual anti-fuse structure.

FIG. 1 illustrates a schematic diagram of a circuit 100 including a dual anti-fuse structure 150. The dual anti-fuse structure 150 includes an anti-fuse 102a and an anti-fuse 102b.

The anti-fuse 102a includes a source 104a, a drain 106a, a programmable gate 108a, and a channel 110a. Initially, the programmable gate 108a and the channel 110a form a high-resistance path for current flow. The source 104a and the drain 106a can be coupled to the high-resistance path through the channel 110a, as shown in FIG. 1. The anti-fuse 102a can be programmed by applying a programming voltage across the programmable gate 108a and the channel 110a so as cause breakdown of a gate dielectric in the programmable gate 108a. Once programmed, the high-resistance path changes from to a low-resistance path to facilitate current flow.

Similarly, the anti-fuse 102b includes a source 104b, a drain 106b, a programmable gate 108b, and a channel 110b. Initially, the programmable gate 108b and the channel 110b form a high-resistance path for current flow. The source 104b and the drain 106b can be coupled to the high-resistance path through the channel 110b, as shown in FIG. 1. The anti-fuse 102b can be programmed by applying a programming voltage across the programmable gate 108b and the channel 110b so as cause breakdown of a gate dielectric in the programmable gate 108b. Once programmed, the high-resistance path changes from to a low-resistance path to facilitate current flow.

In the dual anti-fuse structure 150, the source 104a of the anti-fuse 102a is coupled to the source 104b of the anti-fuse 102b. Furthermore, in the dual anti-fuse structure 150, the drain 106a of the anti-fuse 102a is coupled to the drain 106b of the anti-fuse 102b. However, in some implementations, the source 104a is not coupled to the source 104b and/or the drain 106a is not coupled to the drain 106b in the dual anti-fuse structure 150.

The dual anti-fuse structure 150 can have many different configurations and can be utilized in many different circuits. The circuit 100 illustrates ones such circuit utilizing the dual-anti-fuse structure 150. In the circuit 100, the programmable gate 108a is coupled between a program transistor 114a and a read transistor 116a. Similarly, the programmable gate 108b is coupled between a program transistor 114b and a read transistor 116b. The source 104a and the source 104b are coupled to a ground $G_1$. Also, the drain 106a and the drain 106b are coupled to a ground $G_2$, which can be the same as the ground $G_1$.

In the circuit 100, the anti-fuse 102a can be programmed by, for example, applying a programming voltage $V_{PP1}$ across the programmable gate 108a and the channel 110a through the program transistor 114a, which can be controlled by a gate 120a. The programming voltage $V_{PP1}$ is sufficient to program the anti-fuse 102a by blowing the anti-fuse 102a. The anti-fuse 102a can be read from by, for example, applying a read voltage $V_{DD1}$ to the programmable gate 108a through the read transistor 116a, which can be controlled by a gate 122a. The read voltage $V_{DD1}$ can then be utilized to sense whether or not the anti-fuse 102a has been programmed based on the resistivity of the programmable gate 108a.

Similarly, in the circuit 100, the anti-fuse 102b can be programmed by, for example, applying a programming voltage $V_{PP2}$ across the programmable gate 108b and the channel 110b through the program transistor 114b, which can be controlled by a gate 120b. The programming voltage $V_{PP2}$ is sufficient to program the anti-fuse 102b by blowing the anti-fuse 102b. The anti-fuse 102b can be read from by, for example, applying a read voltage $V_{DD2}$ to the programmable gate 108b through the read transistor 116b, which can be controlled by a gate 122b. The read voltage $V_{DD2}$ can then be utilized to sense whether or not the anti-fuse 102b has been programmed based on the resistivity of the programmable gate 108b.

Thus, the dual-anti fuse structure 150 includes the anti-fuse 102a and the anti-fuse 102b, which can optionally be independently operated as described above. The anti-fuse 102a described above includes the source 104a and the drain 106a for connection to the anti-fuse 102a. However, in some implementations, the source 104a and/or the drain 106a are not included in the dual anti-fuse structure 150 or are not utilized for connection to the anti-fuse 102a. For example, it will be appreciated that the anti-fuse 102a can include the source 104a without the drain 106a or can include the drain 106a without the source 104a. Similarly, the anti-fuse 102b described above includes the source 104b and the drain 106b for connection to the anti-fuse 102b. However, in some implementations, the source 104b and/or the drain 106b are not included in the dual anti-fuse structure 150 or are not utilized for connection to the anti-fuse 102b. For example, it will be appreciated that the anti-fuse 102b can include the source 104b without the drain 106b or can include the drain 106b without the source 104b. However, utilizing the sources 104a and 104b and the drains 106a and 106b can offer various advantages including lowering the resistivity of the anti-fuses 102a and 102b after programming.

Figure 2:
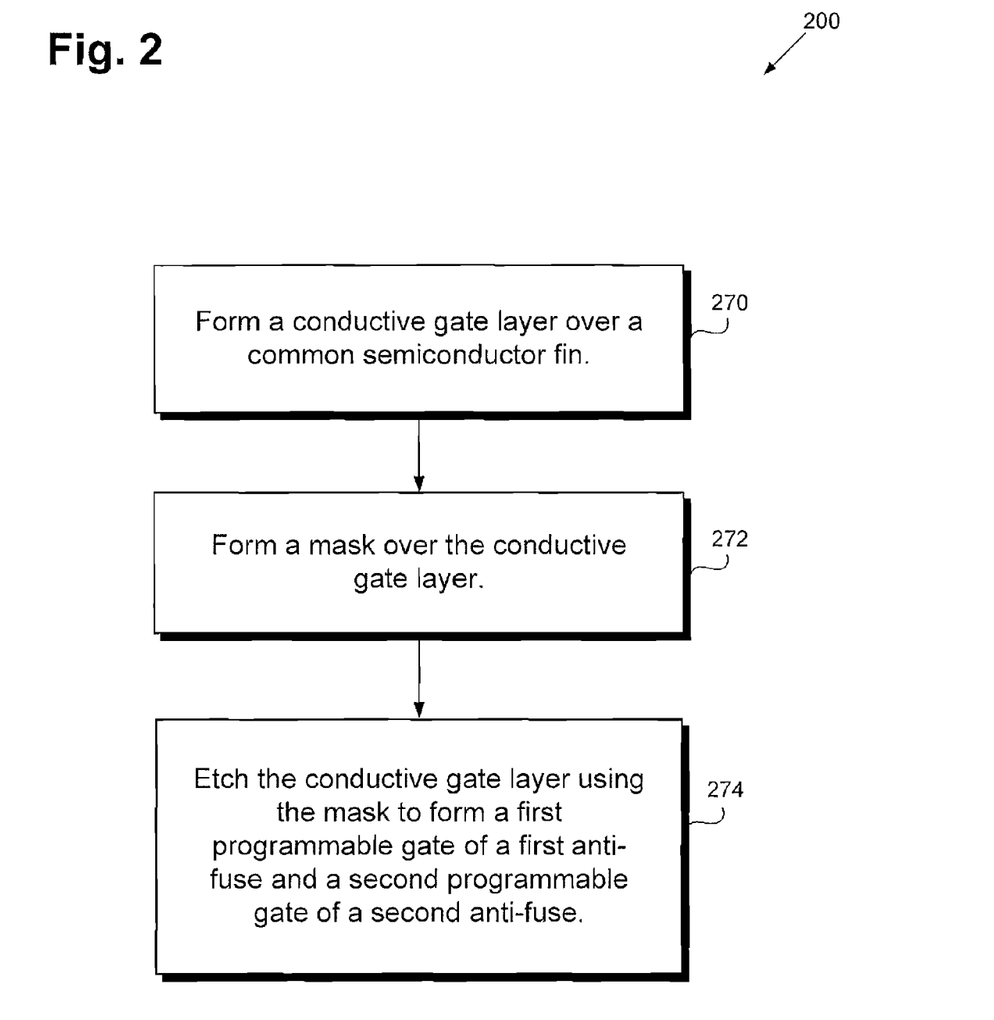
FIG. 2 shows a process flow diagram illustrating an exemplary process for fabricating a dual anti-fuse structure.

FIG. 2 shows a process flow diagram illustrating a process 200 for fabricating a dual anti-fuse structure, such as the dual anti-fuse structure 150 in FIG. 1. It is noted that the dual anti-fuse structure 150, as well as other dual anti-fuse structures in accordance with the present disclosure, can be fabricated utilizing processes other than the process 200. Also, while applicable for fabricating various dual anti-fuse structures, for illustrative purposes, the process 200 is described with respect to FIGS. 3A, 3B, and 3C. The implementation illustrated by the process 200 can be performed on a processed wafer, which prior to the process 200 may include a substrate having a source region, a drain region, and a channel region in a common semiconductor fin, a gate dielectric layer, and a field dielectric layer.

Figure 3A:
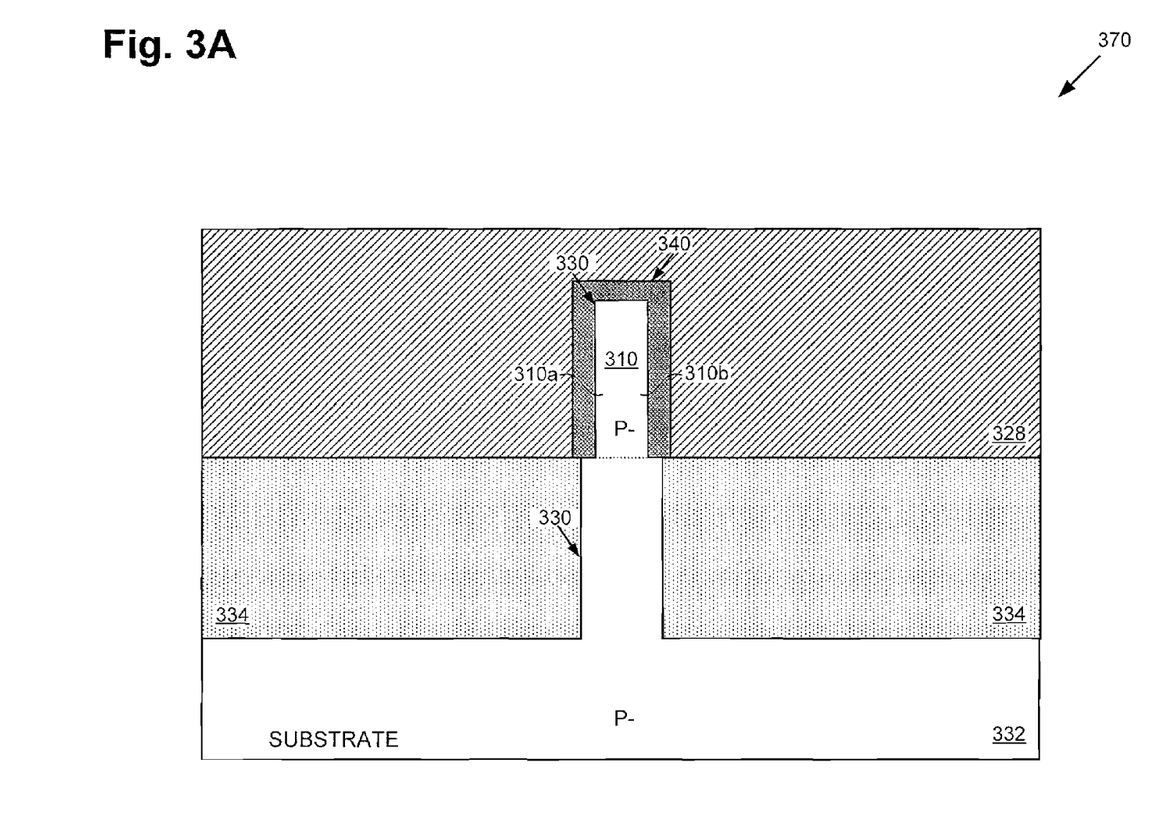
FIG. 3A illustrates a cross-sectional view of a portion of an exemplary wafer during processing.

Referring now to FIG. 2 and FIG. 3A, the process 200 includes forming a conductive gate layer (e.g., 328) over a common semiconductor fin (e.g., 330) (270 in FIG. 2).

FIG. 3A illustrates a cross-sectional view of a portion of a wafer 370 during processing. As shown in FIG. 3A, the wafer 370 includes a substrate 332, a field dielectric layer 334, a common semiconductor fin 330, a gate dielectric layer 340, and a conductive gate layer 328.

In the wafer 370, the substrate 332 includes semiconductor material, such as single-crystal semiconductor material. In the present implementation, the substrate 332 is a silicon substrate and more particularly monocrystalline silicon. In the implementation shown, the substrate 332 is a P type substrate (e.g. a lightly doped P− substrate). It is noted that in other implementations, the substrate 332 is an N type (e.g. a lightly doped N− substrate) substrate or is undoped. Also, in other implementations, the substrate 332 is a semiconductor on insulator substrate, such as a silicon on insulator substrate (SOI) (Not shown).

The common semiconductor fin 330 includes semiconductor material, and in the present implementation is silicon. The common semiconductor fin 330 is formed in and on the substrate 332 and includes channels 310a and 310b situated in a common channel region 310. The common channel region 310 is a doped region of the common semiconductor fin 330. In the present implementation, the common channel region 310 is P type (e.g., lightly doped P−). However, the common channel region 310 can be doped differently than what is shown in FIG. 3A. In some implementations, for example, the common channel region 310 is N type (e.g., lightly doped N−). In the present implementation, the common channel region 310 has a similar doping profile as the substrate 332 as the common channel region 310 is formed from the substrate 332, however, the common channel region 310 can have a different doping profile than the substrate 332. Furthermore, while in the present implementation, the channels 310a and 310b are in the common channel region 310, in some implementations, the channels 310a and 310b are in separate channel regions.

Also in the implementation shown, the field dielectric layer 334 is situated over the substrate 332. The field dielectric layer 334 includes one or more dielectric materials, such as silicon dioxide. In the present implementation, the field dielectric layer 334 is a shallow trench isolation (STI) layer and underlies the conductive gate layer 328 and the gate dielectric layer 340.

The gate dielectric layer 340 is situated over and on the substrate 332, the common semiconductor fin 330, and the field dielectric layer 334. The gate dielectric layer 340 includes dielectric material. Dielectric material suitable for the gate dielectric layer 340 includes gate dielectric material for field-effect transistors (FETs), such as finFETs. In the present implementation, the gate dielectric layer 340 includes high-k dielectric material. Examples of high-k dielectric material for the gate dielectric layer 340 includes, as specific examples, hafnium oxide ($HfO_2$), zirconium oxide ($ZrO_2$), chromium oxide ($CrO_2$), and the like.

The conductive gate layer 328 is situated over the substrate 332 and on the gate dielectric layer 340 and the field dielectric layer 334. The conductive gate layer 328 includes conductive material. Conductive material suitable for the conductive gate layer 328 includes gate material for FETs, such as finFETs. In the present implementation, the conductive gate layer 328 includes metal, such as high-k metal gate material. Examples of high-k metal gate material for the conductive gate layer 328 include, as specific examples, tantalum (Ta), tantalum nitride (TaN), titanium nitride (TiN), molybdenum (Mo), ruthenium (Ru), tantalum carbide nitride (TaCN), or other metal or metal stack.

The conductive gate layer 328 is formed over the common semiconductor fin 330. Prior to forming the conductive gate layer 328, the wafer 370 may also include the field dielectric layer 334, the gate dielectric layer 340, and the common channel region 310 and common source and drain regions in the common semiconductor fin 330 (the common source and drain regions are not shown in FIG. 3A). The conductive gate layer 328 can be formed over the common semiconductor fin 330 by depositing one or more layers of conductive material, such as metal, over the common semiconductor fin 330. The deposition can utilize physical vapor deposition (PVD), chemical vapor deposition (CVD), or another deposition technique. The deposited one or more layers of conductive material can then be planarized utilizing chemical mechanical planarization (CMP) or another planarization technique, resulting in the wafer 370 shown in FIG. 3A.

Figure 3B:
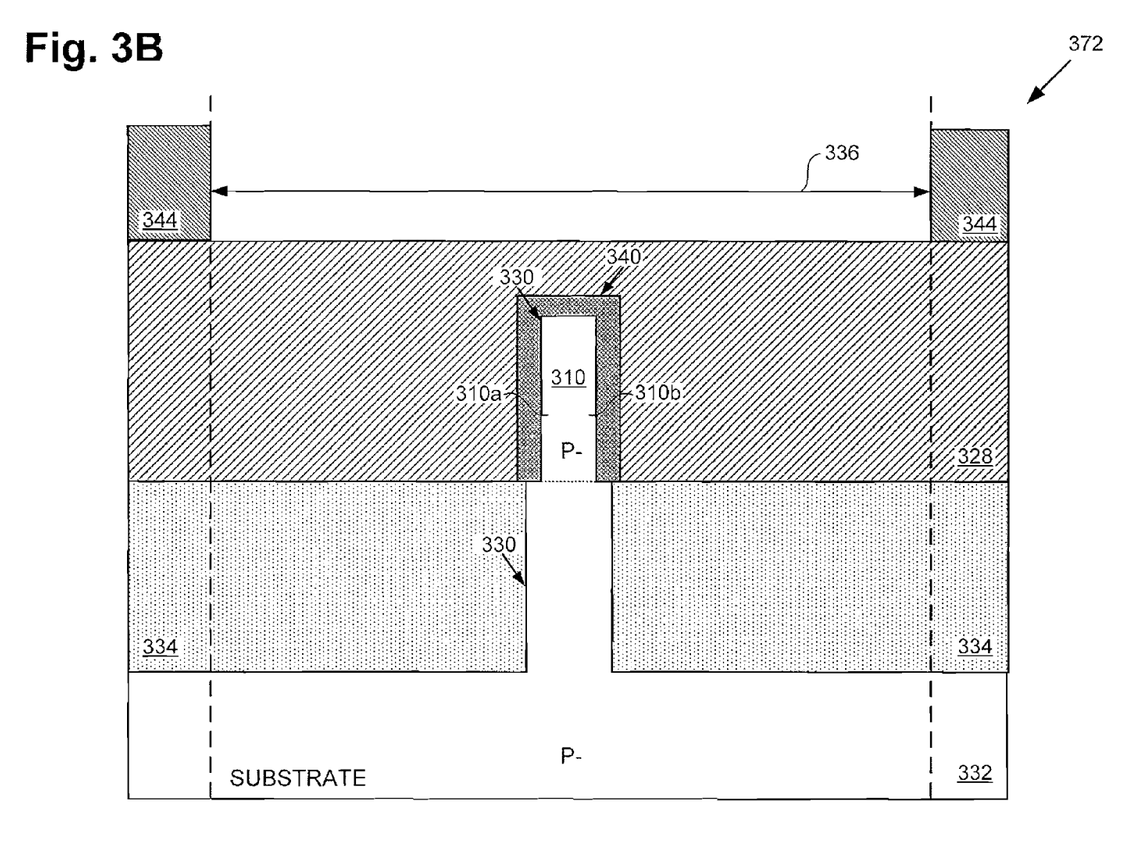
FIG. 3B illustrates a cross-sectional view of a portion of an exemplary wafer during processing.

Referring now to FIG. 2 and FIG. 3B, the process 200 includes forming a mask (e.g., 344) over the conductive gate layer (e.g., 328) (272 in FIG. 2).

FIG. 3B illustrates a cross-sectional view of a portion a wafer 372 during processing. As shown in FIG. 3B, the wafer 372 includes a mask 344 formed over the conductive gate layer 328. The mask 344 exposes a region 336 of the conductive gate layer 328 that overlies the common semiconductor fin 330. The mask 344 can include photoresist. The mask 344 can be formed over the conductive gate layer 328 by applying the photoresist to the wafer 370 of FIG. 3A over the conductive gate layer 328. The photoresist can be patterned to expose the region 336 of the conductive gate layer 328, resulting in the wafer 372 shown in FIG. 3B.

Figure 3C:
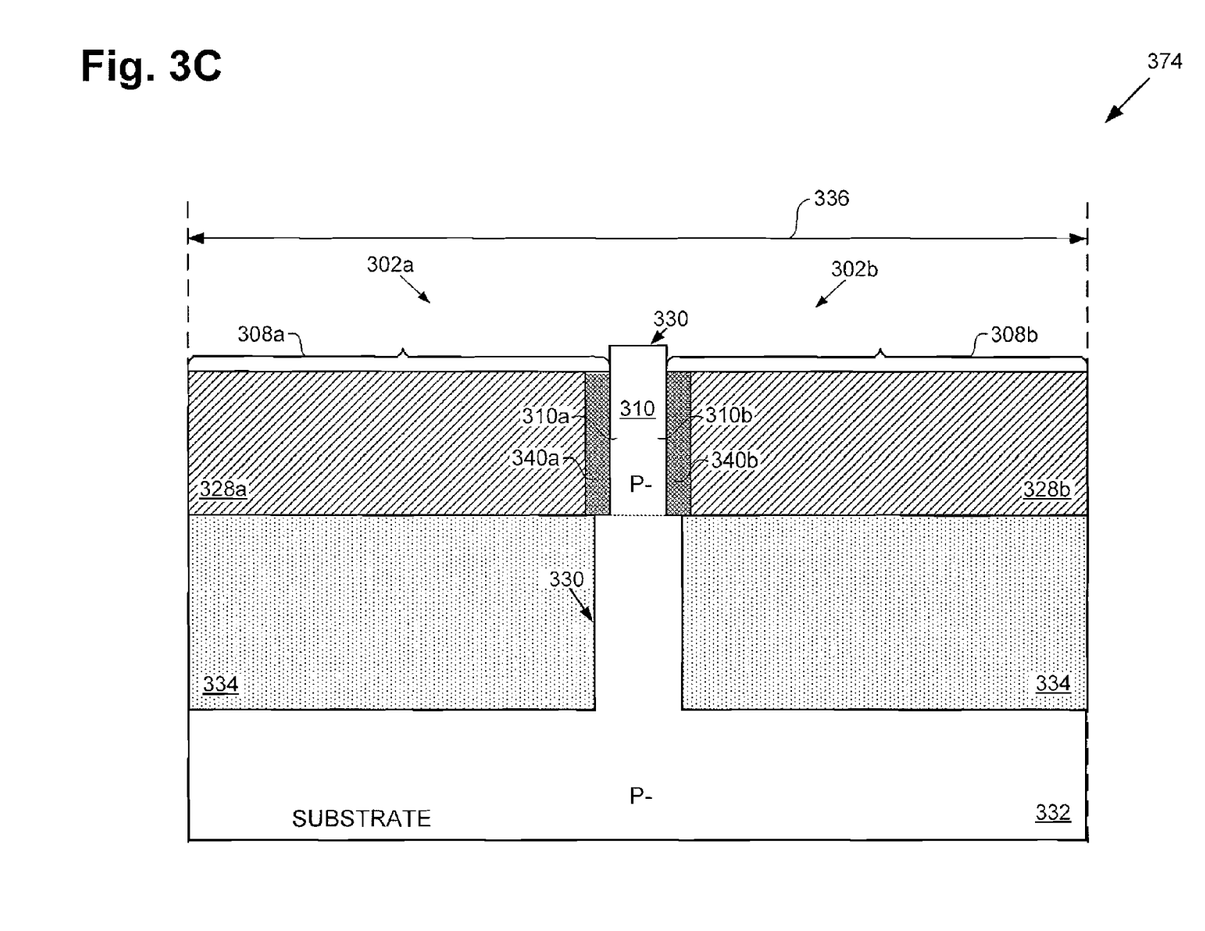
FIG. 3C illustrates a cross-sectional view of a portion of an exemplary wafer during processing.

Referring now to FIG. 2 and FIG. 3C, the process 200 includes etching the conductive gate layer (e.g., 328) using the mask (e.g., 344) to form a first programmable gate (e.g., 308a) of a first anti-fuse (e.g., 302a) and a second programmable gate (e.g., 308b) of a second anti-fuse (e.g., 302b) (274 in FIG. 2).

FIG. 3C illustrates a cross-sectional view of a portion a wafer 374 during processing. It is noted that FIG. 3C shows only the region 336 for clarity. The wafer 374 includes an anti-fuse 302a and an anti-fuse 302b. The anti-fuse 302a includes a programmable gate 308a and the anti-fuse 302b includes a programmable gate 308b. The programmable gate 308a includes an electrode 328a and a gate dielectric 340a. The gate dielectric 340a is in contact with the channel 310a. The programmable gate 308b includes an electrode 328b and a gate dielectric 340b. The gate dielectric 340b is in contact with the channel 310b.

The programmable gate 308a and the programmable gate 308b can be formed by etching the conductive gate layer 328 of the wafer 372 in FIG. 3B using the mask 344 of the wafer 372. The etching forms the programmable gates 308a and 308b by electrically disconnecting portions of the conductive gate layer 328 thereby forming the electrodes 328a and 328b. Subsequently, the mask 344 can be removed, resulting in the wafer 374 shown in FIG. 3C. The etching of the conductive gate layer 328 can also optionally remove a portion of the gate dielectric layer 340 to form the gate dielectrics 340a and 340b. However in some implementations, a dedicated etch can be employed to remove the portion of the gate dielectric layer 340 to form the gate dielectrics 340a and 340b. Furthermore, in some implementations, the portion of the gate dielectric layer 340 may not be etched. For example, the gate dielectric layer 340 can remain covering the common semiconductor fin 330 as in the wafer 372.

Additional processing can be performed on the wafer 374 including formation of contacts and silicide for the contacts. Thus, the process 200 provides for fabrication of dual anti-fuse structure. The process 200 can be integrated into processes for fabrication of one or more finFETs. In some implementations, this integration only requires an addition of the mask 344 for etching the conductive gate layer 328. However, the mask 344 may also be utilized for fabricating finFETs or other components.

Figure 4A:
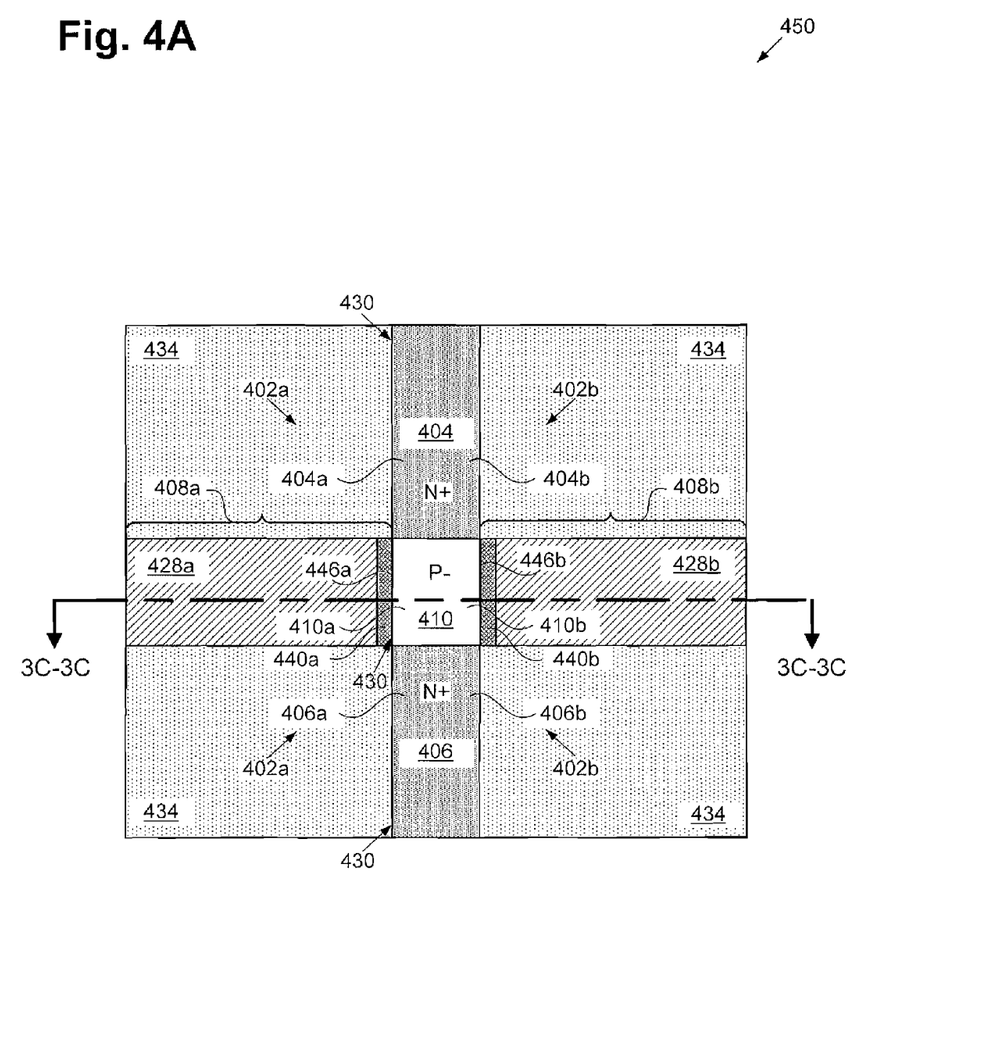
FIG. 4A illustrates a top view of a dual anti-fuse structure.
Figure 4B:
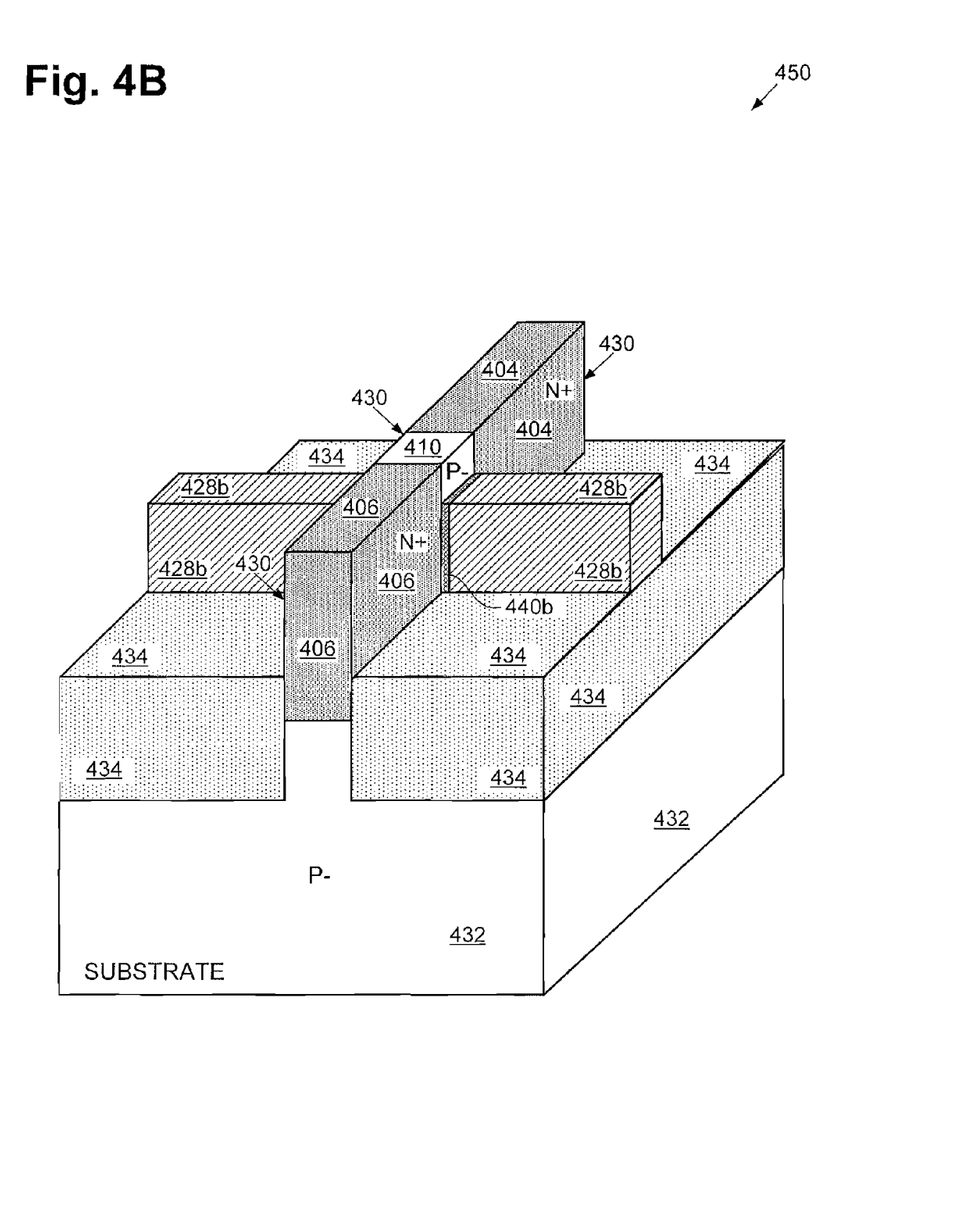
FIG. 4B illustrates a perspective view of a dual anti-fuse structure.

FIG. 4A illustrates a top view of a dual anti-fuse structure 450. FIG. 4B illustrates a perspective view of the dual anti-fuse structure 450. The dual anti-fuse structure 450 corresponds to the dual anti-fuse structure 150 in FIG. 1. Furthermore, the dual anti-fuse structure 450 corresponds to the region 336 of the wafer 374 in FIG. 3C along cross-section 3C-3C in FIG. 4A.

The dual anti-fuse structure 450 includes an anti-fuse 402a and an anti-fuse 402b corresponding respectively to the anti-fuse 102a and the anti-fuse 102b in FIG. 1 and the anti-fuse 302a and the anti-fuse 302b in FIG. 3C. The dual anti-fuse structure 450 further includes a substrate 432, a common semiconductor fin 430, a common channel region 410, and a field dielectric layer 434 corresponding respectively to the substrate 332, the common semiconductor fin 330, the common channel region 310, and the field dielectric layer 334 in FIG. 3C.

The anti-fuse 402a includes a channel 410a, a source 404a, a drain 406a, and a programmable gate 408a. The channel 410a, the source 404a, the drain 406a, and the programmable gate 408a correspond respectively to the channel 110a, the source 104a, the drain 106a, and the programmable gate 108a in FIG. 1. The channel 410a further corresponds to the channel 310a in FIG. 3C. Also, while not shown in FIG. 3C, the source 404a and the drain 406a can have corresponding constituents in the wafer 374 in FIG. 3C, which can be in the common semiconductor fin 330 prior to forming the wafer 370 in FIG. 3A. The programmable gate 408a includes a gate dielectric 440a and an electrode 428a corresponding respectively to the gate dielectric 340a and the electrode 328a in FIG. 3C.

Similarly, the anti-fuse 402b includes a channel 410b, a source 404b, a drain 406b, and a programmable gate 408b. The channel 410b, the source 404b, the drain 406b, and the programmable gate 408b correspond respectively to the channel 110b, the source 104b, the drain 106b, and the programmable gate 108b in FIG. 1. The channel 410b further corresponds to the channel 310b in FIG. 3C. Also, while not shown in FIG. 3C, the source 404h and the drain 406b can have corresponding constituents in the wafer 374 in FIG. 3C, which can be in the common semiconductor fin 330 prior to forming the wafer 370 in FIG. 3A. The programmable gate 408b includes a gate dielectric 440b and an electrode 428b corresponding respectively to the gate dielectric 340b and the electrode 328b in FIG. 3C.

In the present implementation, the sources 404a and 404b are situated in a common source region 404. The common source region 404 is a doped region of the common semiconductor fin 430. In the present implementation, the common source region 404 is N type (e.g., highly doped N+). However, the common source region 404 can be doped differently than what is shown in FIGS. 4A and 4B. In some implementations, for example, the common source region 404 is P type (e.g., highly doped P+). While in the present implementation, the sources 404a and 404b are in the common source region 404, in some implementations, the sources 404a and 404b are in separate source regions.

Similarly, the drains 406a and 406b are situated in a common drain region 406. The common drain region 406 is a doped region of the common semiconductor fin 430. In the present implementation, the common drain region 406 is N type (e.g., highly doped N+). However, the common drain region 406 can be doped differently than what is shown in FIGS. 4A and 4B. In some implementations, for example, the common drain region 406 is P type (e.g., highly doped P+). While in the present implementation, the drains 406a and 406b are in the common drain region 406, in some implementations, the drains 406a and 406b are in separate drain regions. The sources 404a and 404b and the drains 406a and 406b can be doped the same or differently with respect to one another.

Thus, the dual anti-fuse structure 450 includes the channels 410a and 410b, the sources 404a and 404b, and the drains 406a and 406b each situated in the common semiconductor fin 430. The the common source region 404 and the common drain region 406 can optionally be be formed concurrently with a source region and a drain region of a finFET. Also, the common channel region 410 can optionally be formed concurrently with a channel region of the finFET. As such, the common source region 404, the common source region 404, and the common drain region 406 may be integrated into a process for fabricating a finFET without requiring additional processing steps.

The channel 410a in the common semiconductor fin 430 is adjacent to the programmable gate 408a. The programmable gate 408a is on a sidewall 446a of the common semiconductor fin 430. The anti-fuse 402a is formed between the channel 410a and the programmable gate 408a. The channel 410b in the common semiconductor fin 430 is adjacent to the programmable gate 408b. The programmable gate 408b is on a sidewall 446b of the common semiconductor fin 430. The anti-fuse 402b is formed between the channel 410b and the programmable gate 408b.

Various configurations of the dual anti-fuse structure 450 allow for the anti-fuse 402*a* and the anti-fuse 402*b* to be programmed. The anti-fuse 402*a* can be programmed, for example, by applying a programming voltage across the programmable gate 408*a* and the channel 410*a* so as cause breakdown of the gate dielectric 440*a* in the programmable gate 408*a*. For example, the source 404*a* and/or the drain 406*a* can be coupled to ground and a programming voltage can be applied to the electrode 428*a* to breakdown the gate dielectric 440*a*. Once programmed, the electrode 428*a* has a low resistance path to a diode and/or diodes formed by the channel 410*a* and the source 404*a* and/or the channel 410*a* and the drain 406*a*. Utilizing both the source 404*a* and the drain 406*a* for connection to the anti-fuse 402*a* offers a low resistivity current path, however, it will be appreciated that the anti-fuse 402*a* can function with only one of the source 404*a* and the drain 406*a*. Thus, some implementations may not include one of the source 404*a* and the drain 406*a* or may not connect to one of the source 404*a* and the drain 406*a*.

Similarly, the anti-fuse 402*b* can be programmed by applying a programming voltage across the programmable gate 408*b* and the channel 410*b* so as cause breakdown of the gate dielectric 440*b* in the programmable gate 408*b*. For example, the source 404*b* and/or the drain 406*b* can be coupled to ground and a programming voltage can be applied to the electrode 428*b* to breakdown the gate dielectric 440*b*. Once programmed, the electrode 428*b* has a low resistance path to a diode and/or diodes formed by the channel 410*b* and the source 404*b* and/or the channel 410*b* and the drain 406*b*. Utilizing both the source 404*b* and the drain 406*b* for connection to the anti-fuse 402*b* offers a low resistivity current path, however, it will be appreciated that the anti-fuse 402*b* can function with only one of the source 404*b* and the drain 406*b*. Thus, some implementations may not include one of the source 404*b* and the drain 406*b* or may not connect to one of the source 404*b* and the drain 406*b*.

By including the channel 410*a* and the channel 410*b* in the common semiconductor fin 430, the dual anti-fuse structure 450 provides for the anti-fuse 402*a* and the anti-fuse 402*b* being compact while still being capable of independent operation. The channels 410*a* and 410*b* are each situated between the programmable gate 408*a* and the programmable gate 408*b*. Additionally, the channels 410*a* and 410*b* are each situated between the source 404*a* and the drain 406*a* and also are each situated between the source 404*b* and the drain 406*b*. Utilizing such an arrangement allows for, among other advantages, further compactness of the dual anti-fuse structure 450 as well as concurrent fabrication of the anti-fuses 402*a* and 402*b*.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A dual anti-fuse structure comprising:
    a first channel in a common semiconductor fin adjacent to a first programmable gate comprising a first gate dielectric;
    a second channel in said common semiconductor fin adjacent to a second programmable gate comprising a second gate dielectric physically separate from said first gate dielectric;
    a first anti-fuse formed between said first channel and said first programmable gate, said first anti-fuse including a first source and a first drain situated in said common semiconductor fin; and
    a second anti-fuse formed between said second channel and said second programmable gate, said second anti-fuse including a second source and a second drain situated in said common semiconductor fin, wherein
    a region of the common semiconductor fin between the first gate dielectric and the second gate dielectric is doped differently from other portions of the common semiconductor fin.

2. The dual anti-fuse structure of claim 1, wherein said first programmable gate is on a first sidewall of said common semiconductor fin.

3. The dual anti-fuse structure of claim 1, wherein said second programmable gate is on a second sidewall of said common semiconductor fin.

4. The dual anti-fuse structure of claim 1, wherein said first channel is situated between said first programmable gate and said second programmable gate.

5. The dual anti-fuse structure of claim 1, wherein said second channel is situated between said first programmable gate and said second programmable gate.

6. The dual anti-fuse structure of claim 1, wherein said first channel and said second channel are situated in a common channel region.

7. The dual anti-fuse structure of claim 1, wherein
    said first gate dielectric and said second gate dielectric are formed of a same material.

8. The dual anti-fuse structure of claim 1, wherein a region of said common semiconductor fin between said first gate dielectric and said second gate dielectric has a similar doping profile to the substrate, which is different from other portions of said common semiconductor fin.

9. A dual anti-fuse structure comprising:
    a first anti-fuse including a first channel, a first source, and a first drain situated in a common semiconductor fin;
    a second anti-fuse including a second channel, a second source, and a second drain situated in said common semiconductor fin;
    said first anti-fuse formed between said first channel and a first programmable gate comprising a first electrode;
    said second anti-fuse formed between said second channel and a second programmable gate comprising a second electrode that is physically separate from said first electrode; and
    a substrate on which a first field dielectric layer, a second field dielectric layer and said common semiconductor fin are disposed, wherein
    said first field dielectric layer is disposed between said substrate and said first programmable gate and said second field dielectric layer is disposed between said substrate and said second programmable gate.

10. The dual anti-fuse structure of claim 9, wherein said first source and said second source are situated in a common source region.

11. The dual anti-fuse structure of claim 9, wherein said first drain and said second drain are situated in a common drain region.

12. The dual anti-fuse structure of claim 9, wherein said first channel and said second channel are situated between said first source and said first drain.

13. The dual anti-fuse structure of claim 9, wherein said first channel and said second channel are situated between said second source and said second drain.

14. The dual anti-fuse structure of claim 9, further comprising:
the first programmable gate comprising a first gate dielectric and said first electrode, said first gate dielectric being in contact with said first channel; and
the second programmable gate comprising a second gate dielectric and said second electrode, said second gate dielectric being in contact with said second channel.

15. The dual anti-fuse structure of claim 9, wherein
said first field dielectric layer and said second field dielectric layer are composed of a material different from a material of the substrate.

16. The dual anti-fuse structure of claim 9, wherein
said substrate is in direct contact with said common semiconductor fin and has a different doping profile than said semiconductor fin.

17. A dual anti-fuse structure comprising:
a first anti-fuse including a first source and a first drain situated in a common semiconductor fin;
a second anti-fuse including a second source and a second drain situated in said common semiconductor fin;
a first programmable gate adjacent to said common semiconductor fin, said first programmable gate including a first gate dielectric and a first electrode;
a second programmable gate adjacent to said common semiconductor fin, said second programmable gate including a second gate dielectric and a second electrode; and
a substrate on which a first field dielectric layer, a second field dielectric layer and said common semiconductor fin are disposed, wherein
said first field dielectric layer is disposed between said substrate and said first programmable gate and said second field dielectric layer is disposed between said substrate and said second programmable gate,
said first gate dielectric is physically separate from said second gate dielectric, and
said first electrode is physically separate from said second electrode.

18. The dual anti-fuse structure of claim 17, further comprising:
a first channel in said common semiconductor fin adjacent to said first programmable gate;
a second channel in said common semiconductor fin adjacent to said second programmable gate.

19. The dual anti-fuse structure of claim 18, wherein
said first gate dielectric is in contact with said first channel; and
said second gate dielectric is contact with said second channel.

20. The dual anti-fuse structure of claim 17, wherein
a top portion of said substrate is in direct contact with said common semiconductor fin and with at least a portion of a bottom surface of said first gate dielectric and said second gate dielectric.

21. The dual anti-fuse structure of claim 17, wherein said first gate dielectric comprises a high-k dielectric material and said first electrode comprises a metal.

22. The dual anti-fuse structure of claim 17, wherein said second gate dielectric comprises a high-k dielectric material and said second electrode comprises a metal.

* * * * *

UNITED STATES PATENT AND TRADEMARK OFFICE
CERTIFICATE OF CORRECTION

| | | |
|---|---|---|
| PATENT NO. | : 9,536,883 B2 | Page 1 of 1 |
| APPLICATION NO. | : 13/548123 | |
| DATED | : January 3, 2017 | |
| INVENTOR(S) | : Frank Hui et al. | |

It is certified that error appears in the above-identified patent and that said Letters Patent is hereby corrected as shown below:

On the Title Page

Item (75), the Inventors' information is incorrect. Item (75) should read:

--(75) Inventors: Frank Hui, Irvine, CA (US)
                  Neal Kistler, Laguna Niguel, CA (US)--

Signed and Sealed this
Third Day of April, 2018

Andrei Iancu
*Director of the United States Patent and Trademark Office*